(12) United States Patent
Hidaka

(10) Patent No.: US 7,289,555 B2
(45) Date of Patent: Oct. 30, 2007

(54) METHOD AND SYSTEM FOR SIGNAL PROCESSING USING VECTOR OUTPUT FROM SCALAR DATA

(75) Inventor: Yasuo Hidaka, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 1011 days.

(21) Appl. No.: 10/359,379

(22) Filed: Feb. 5, 2003

(65) Prior Publication Data

US 2004/0151240 A1    Aug. 5, 2004

(51) Int. Cl.
*H04Q 1/20* (2006.01)
*G06F 17/10* (2006.01)

(52) U.S. Cl. .................. 375/229; 375/232; 708/322; 708/323

(58) Field of Classification Search .................. None
See application file for complete search history.

(56) References Cited

U.S. PATENT DOCUMENTS

| | | | |
|---|---|---|---|
| 4,389,636 A | 6/1983 | Riddle, Jr. | 340/347 |
| 4,550,415 A * | 10/1985 | Debus et al. | 375/234 |
| 4,669,092 A * | 5/1987 | Sari et al. | 375/232 |
| 4,701,923 A | 10/1987 | Fukasawa et al. | 371/41 |
| 5,010,558 A | 4/1991 | Yost et al. | 375/37 |
| 5,353,306 A | 10/1994 | Yamamoto | 375/233 |
| 5,570,396 A * | 10/1996 | Bergmans et al. | 375/355 |
| 6,182,264 B1 | 1/2001 | Ott | 714/774 |
| 6,243,841 B1 | 6/2001 | Mydill | 714/724 |
| 6,301,298 B1 | 10/2001 | Kuntz et al. | 375/232 |
| 6,788,749 B2 * | 9/2004 | Voorman et al. | 375/340 |
| 6,834,035 B1 | 12/2004 | Marukawa et al. | 369/59.22 |
| 6,944,244 B2 | 9/2005 | Belotserkovsky et al. | 375/350 |
| 7,110,448 B2 * | 9/2006 | Bergmans et al. | 375/233 |

OTHER PUBLICATIONS

Wikipedia, "Phase(Waves)", http://en.wikipedia.org/wiki/Phase_(waves), pp. 1-3.*
Johns, David A. and Essig, Daniel, "*Integrated Circuits for Data Transmission Over Twisted-Pair Channels*", IEEE Journal of Solid-State Circuits, vol. 32, No. 3, Mar. 1997, pp. 398-406, Mar. 1997.
Azadet, Kamran, et al., WA 18.3 "*A Gigabit Transceiver Chip Set for UTP CAT-6 Cables in Digital CMOS Technology*", 2000 IEEE International Solid-State Circuits Conference, 9 pages, 2000.

(Continued)

*Primary Examiner*—David C. Payne
*Assistant Examiner*—Linda Wong
(74) *Attorney, Agent, or Firm*—Baker Botts LLP

(57) ABSTRACT

A method for processing a signal includes receiving a signal from a channel at a channel speed and providing error adjustment to the signal. The method includes sampling the signal at a speed less than the channel speed to yield sampled scalar data. The signal is sampled at a first phase. The method includes determining a sampled scalar error associated with the signal at a second phase. The difference between the first phase and the second phase comprises a delay. The method also includes forming a cross-correlation vector from the sampled scalar error and the sampled scalar data at a vector speed. The vector speed is less than the speed at which the signal is sampled. The method also includes determining compensation information for the error adjustment. The compensation information is based on the cross-correlation vector, and the compensation information is determined at the vector speed.

22 Claims, 4 Drawing Sheets

OTHER PUBLICATIONS

Shakiba, Mohammad Hossein, et al, "*An Integrated 200-MHz 3.3-V BiCMOS Class-IV Partial-Response Analog Viterbi Decoder*", IEEE Journal of Solid-State Circuits, vol. 33, No. 1, Jan. 1998, pp. 61-75.

U.S. Appl. No. 10/359,361, entitled *Method and System for Processing a Sampled Signal*, filed Feb. 5, 2003, inventor Yasuo (nmi) Hidaka, 36 pages of Specification, Claims and Abstract, and 3 sheets of drawings.

U.S. Appl. No. 10/359,332, entitled *Method and System for Providing Error Compensation to a Signal Using Feedback Control*, filed Feb. 5, 2003, inventor Yasuo (nmi) Hidaka, 38 pages of Specification, Claims and Abstract, and 4 sheets of drawings.

U.S. Patent Application, entitled "*Equalizing a Signal for Transmission*", filed Feb. 3, 2003, inventors Koyanagi, Yoichi (nmi), et al, 27 pages of Specification, Claims and Abstract, and 4 sheets of drawings.

\* cited by examiner

METHOD AND SYSTEM FOR SIGNAL PROCESSING USING VECTOR OUTPUT FROM SCALAR DATA

RELATED APPLICATIONS

This application is related to U.S. patent application Ser. No. 10/359,361, entitled "METHOD AND SYSTEM FOR PROCESSING A SAMPLED SIGNAL," Attorney's Docket 073338.0128, and U.S. patent application Ser. No. 10/359,332, entitled "METHOD AND SYSTEM FOR PROVIDING ERROR COMPENSATION TO A SIGNAL USING FEEDBACK CONTROL," both filed concurrently with the present application.

TECHNICAL FIELD OF THE INVENTION

This invention relates generally to the field of data communication and more specifically to a method and system for signal processing using vector output from scalar data.

BACKGROUND OF THE INVENTION

Signals received at a receiver are typically processed to compensate for interference due to frequency dependent loss. As an example, adaptive equalization is performed to compensate for inter-symbol interference due to channel loss. Known techniques for adaptive equalization have been used in the area of digital magnetic/optical recording and low speed digital communication such as modem and wireless communication. These techniques typically determine cross-correlation between amplitude error and logic data points of the signal to create a vector output used in error compensation. The vector output is typically created at the speed of the channel for fast tracking error compensation for channel variation.

SUMMARY OF THE INVENTION

The present invention provides a method and system for signal processing using vector output from scalar data that substantially eliminates or reduces at least some of the disadvantages and problems associated with previous signal processing methods and systems.

In accordance with a particular embodiment of the present invention, a method for processing a signal includes receiving a signal from a channel at a channel speed and providing error adjustment to the signal. The method includes sampling the signal at a speed less than the channel speed to yield sampled scalar data. The signal is sampled at a first phase. The method includes determining a sampled scalar error associated with the signal at a second phase. The difference between the first phase and the second phase comprises a delay. The method also includes forming a cross-correlation vector from the sampled scalar error and the sampled scalar data at a vector speed. The vector speed is less than the speed at which the signal is sampled. The method also includes determining compensation information for the error adjustment. The compensation information is based on the cross-correlation vector, and the compensation information is determined at the vector speed.

Forming a cross-correlation vector from the sampled scalar error and the sampled scalar data may comprise forming a plurality of cross-correlated data points of the sampled scalar data cross-correlated with the sampled scalar error by varying the delay, accumulating the plurality of cross-correlated data points and forming a cross-correlation vector from the plurality of cross-correlated data points.

In accordance with another embodiment, a system for processing a signal includes an adjustable filter operable to provide error adjustment to a signal received from a channel at a channel speed and a sampling switch operable to sample the signal at a speed less than the channel speed to yield sampled scalar data. The sampling switch is operable to sample the signal at a first phase. The system includes an error calculator operable to determine a sampled scalar error associated with the signal at a second phase. The difference between the first phase and the second phase comprises a delay. The system includes an accumulator operable to form a cross-correlation vector from the sampled scalar error and the sampled scalar data at a vector speed. The vector speed is less than the speed at which the signal is sampled. The system also includes adaptation control operable to determine compensation information for the adjustable filter for providing error adjustment to the signal. The compensation information is based on the cross-correlation vector, and the compensation information is determined at the vector speed.

Technical advantages of particular embodiments of the present invention include an adaptive equalization system that uses an accumulator to accumulate data points from a sampled scalar error and sampled scalar data and form a vector output used to determine error compensation at a speed slower than the channel speed. Because the vector output is formed from scalar data (as opposed to being formed from vector data all the time), the circuitry of the system may be less complex, and the amount of hardware necessary for operation may be reduced.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION OF THE INVENTION

Figure 1:
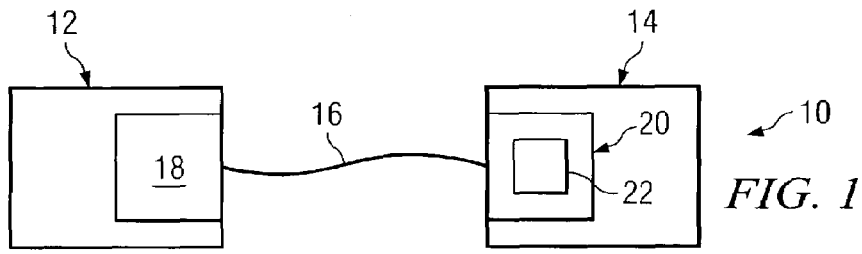
FIG. 1 illustrates a network system having a receiver with an adaptive equalization system, in accordance with an embodiment of the present invention.

FIG. 1 illustrates a network system 10 having a receiver 20 with an adaptive equalization system 22, in accordance with an embodiment of the present invention. Adaptive equalization system 22 performs signal processing on a signal received at receiver 20. The signal processing may be performed at a lower speed than the full channel speed of the signal. Thus, the negative impact of signal processing on speed of the signal may be reduced, and the signal speed through the channel may therefore be improved.

Network system 10 includes network elements 12 and 14 coupled together by a channel 16. Network elements 12 and 14 may comprise servers, storage systems, routers, computer systems or any combination thereof. Channel 16 communicates signals between network elements 12 and 14. Channel 16 may comprise a cable having a length in the range of ten to one hundred meters, for example approximately twenty to forty meters. The speed of a signal travelling over channel 16 may be in the range of multi-gigabits per second, for example, approximately three gigabits per second. As an example, channel 16 may operate according to 10 Gigabit Attachment Unit Interface (XAUI) standards, which require a fixed frequency of approximately one to five gigahertz, for example, 3.125 gigahertz, and which are used for 10 Gigabit Ethernet communications.

Signals traveling at high speeds are susceptible to distortion resulting from a spread impulse response of channel 16. Channel 16 may cause frequency dependent distortion due to skin effect and dieletric loss. Such distortion may cause inter-symbol interference (ISI). To overcome ISI, multi-gigabit rate electrical communication over several tens of meters may utilize high-degree equalization over approximately twenty to forty dB. Particular embodiments of the present invention use advanced signal-processing technologies to provide high-degree equalization to multi-gigabit rate communications over channel 16.

Network element 12 includes a transmitter 18, and, as illustrated, network element 14 includes receiver 20. Transmitter 18 transmits a data sequence or signal over channel 16 to receiver 20. Adaptive equalization system 22 provides high-degree equalization to overcome ISI in the signal communicated through channel 16.

Figure 2:
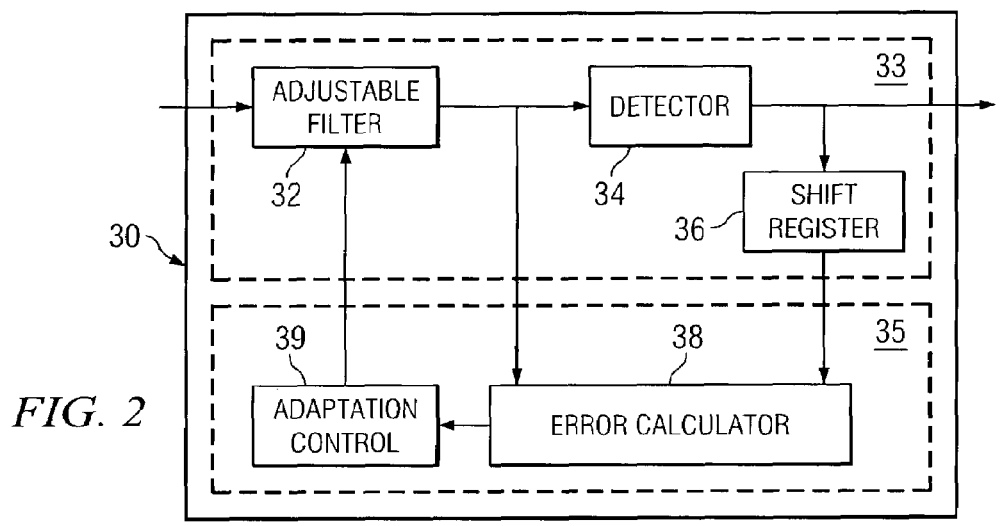
FIG. 2 illustrates an adaptive equalization system for processing a received signal, in accordance with an embodiment of the present invention.

FIG. 2 illustrates an adaptive equalization system 30 for processing a received signal, in accordance with an embodiment of the present invention. Adaptive equalization system 30 includes an adjustable filter 32, a detector 34, a shift register 36, an error calculator 38 and adaptation control 39.

Adjustable filter 32 receives a signal that has been transmitted over a channel, such as channel 16 of FIG. 1. Adjustable filter 32 compensates for distortion in the signal caused by the channel. Control and adjustment of adjustable filter 32 is provided by adaptation control 39. Particular embodiments may utilize an adjustable filter implemented as a discrete-time digital filter, a discrete-time analog filter or a continuous-time analog filter.

After the signal has passed through adjustable filter 32, it travels to detector 34, which recovers the originally transmitted data sequence. Detector 34 may be any of a number of types of detectors, such as a decision feedback detector or a direct detector. Shift register 36 provides a delay element to form a vector composed of a series of data points from the signal. The signal is sampled at a particular interval before entering error calculator 38. Error calculator 38 performs signal processing to calculate an error associated with the sampled signal. Such error may comprise an amplitude error.

The calculated error is then used by adaptation control 39 to determine parameters or instructions for adjustable filter 32. Adjustable filter 32 uses such instructions to provide compensation to subsequent signals for distortion caused by the channel.

In the illustrated embodiment, component box 33 includes adjustable filter 32, detector 34 and shift register 36; and component box 35 includes error calculator 38 and adaptation control 39. Component boxes 33 and 35 may be implemented as digital circuits, analog circuits or a combination of digital and analog circuits. The components of component box 33 operate at the speed of the channel, for example the speed of channel 16 of FIG. 1. The signal is sampled at a particular interval before entering component box 35, so the components of component box 35 operate at such interval. Since the components of component box 35 only operate at a particular interval, such components operate at a slower operational speed than the components of component box 33. Thus, the negative impact of the error calculation and adaptation control functions of component box 35 on the speed of adaptive equalization system 30 is reduced since those functions only operate at the intervals of the sampled signal and not at the full channel speed of the components of component box 33. Since error is only determined at the intervals of the sampled signal, continuous error calculation and fast tracking compensation is sacrificed. However, such fast tracking capability is less important in multi-gigabit rate electrical communication for some applications. Therefore, the sampling of received signals for signal processing reduces the negative impact of the signal processing on the full channel speed. Thus, a higher channel speed may be obtained.

Figure 3:
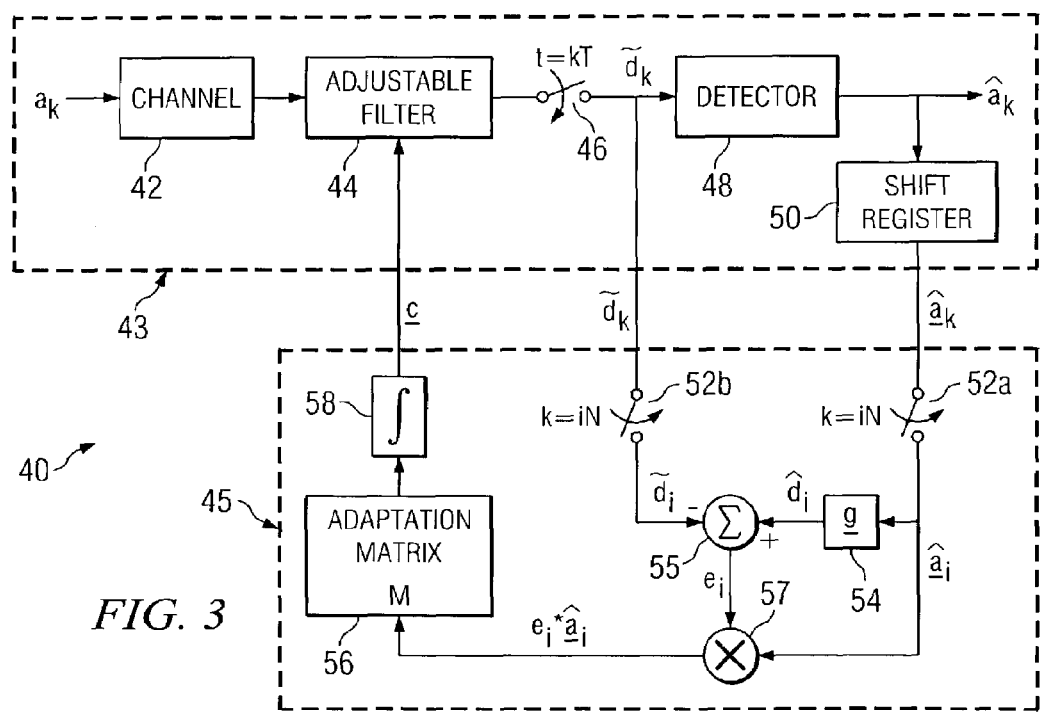
FIG. 3 illustrates an adaptive equalization system with subsampling switches, in accordance with a particular embodiment of the present invention.

FIG. 3 illustrates an adaptive equalization system 40, with subsampling switches 52, in accordance with a particular embodiment of the present invention. Adaptive equalization system 40 receives a transmitted data sequence that has passed through channel 42. Adaptive equalization system 40 includes an adjustable filter 44, a sampling switch 46, a detector 48, a shift register 50, subsampling switches 52, target response filter 54, summation node 55, multiplication node 57, adaptation matrix 56, and integrator bank 58.

Adjustable filter 44 receives transmitted data sequence $\alpha_k$ after the signal has traveled over channel 42. Channel 42 causes some distortion in the signal. Adjustable filter 44 compensates for such distortion caused by the channel. Control and adjustment of adjustable filter 44 is determined by a compensation vector, filter coefficient vector $\underline{c}$, which is produced by integrator bank 58. Particular embodiments may include an adjustable filter located after a sampling switch or before a channel through which the signal is communicated, as illustrated with respect to FIGS. 5 and 7, respectively.

After the data sequence $\alpha_k$ has passed through adjustable filter 44, it is sampled at sampling switch 46. Sampling switch 46 yields a sampled signal $\tilde{d}_k$. The data sequence may be sampled at sampling time t=kT, where T represents a sampling period. Sampled signal $\tilde{d}_k$ enters detector 48, which removes noise in the signal to recover the originally transmitted noiseless data sequence $\hat{\alpha}_k$.

Shift register 50 provides a delay element to form a vector composed of a series of data points. The output of shift register 50 is a noiseless data vector $\underline{\hat{\alpha}}_k$. The length of the data vector $\underline{\hat{\alpha}}_k$ produced by shift register 50 depends on the characteristics of the channel through which the signal was transmitted.

Figure 5:
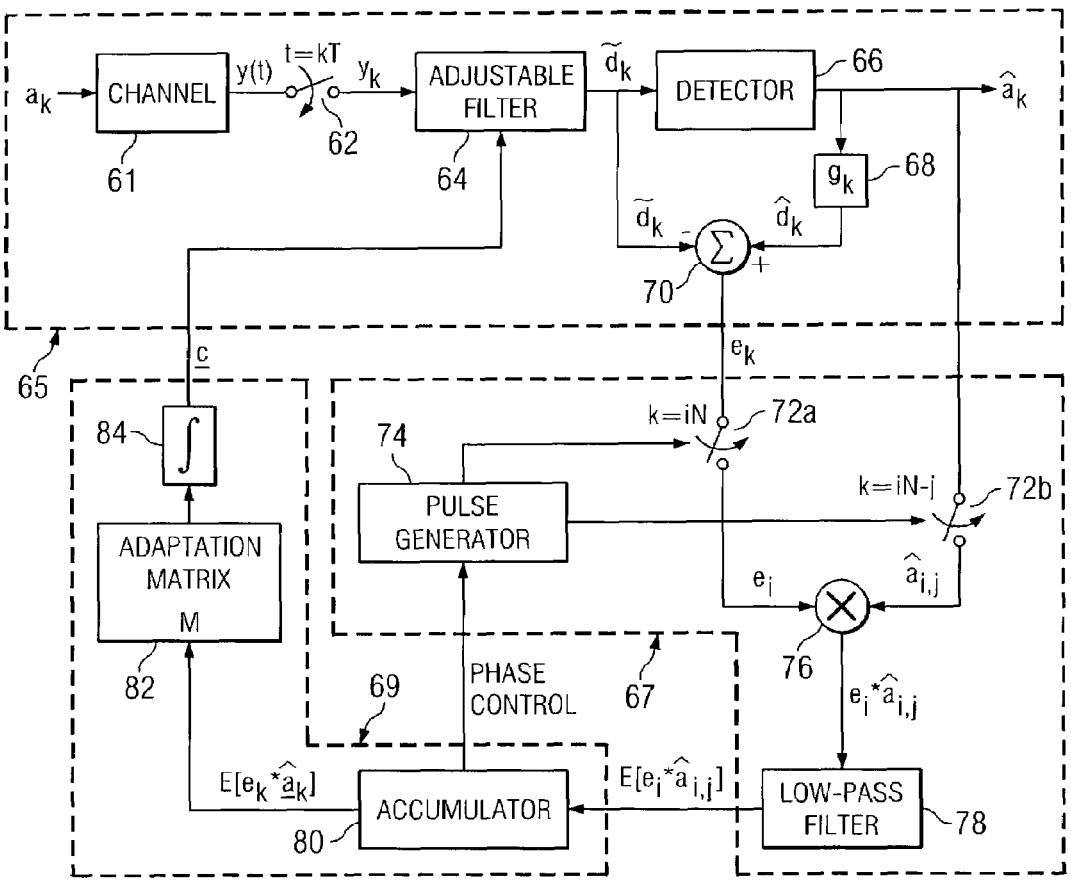
FIG. 5 illustrates an adaptive equalization system utilizing an accumulator for producing vector output, in accordance with another embodiment of the present invention.

The output of shift register 50, data vector $\underline{\hat{\alpha}}_k$, is sampled at subsampling switch 52a at sampling time k=iN, where N represents a subsampling rate, to yield data vector $\hat{\alpha}_i$. The subscript i corresponds to the index of the sub-sampled data series, and $\hat{\alpha}_i$ is an abbreviated notation of $\hat{\alpha}_{iN}$ that is a sub-sampled data series with sub-sampling rate of N. Thus, $\hat{\alpha}_i$ refers to $\hat{\alpha}_{0N}, \hat{\alpha}_{1N}, \hat{\alpha}_{2N}, \hat{\alpha}_{3N}, \ldots \hat{\alpha}_{iN}, \ldots$ It should be understood that subsampling or subsampling switches as used herein may also refer to sampling or sampling switches, respectively. Target response filter 54 calculates a sub-sampled expected predetection signal đhd i, or the signal that is expected to be output from adjustable filter 44. Particular embodiments may include a target response filter positioned before subsampling occurs, as illustrated in FIG. 5.

Subsampling switch 52b subsamples the sampled signal $\tilde{d}_k$ at sampling time k=iN to generate subsampled signal $\tilde{d}_i$. At summation node 55, the subsampled signal $\tilde{d}_i$ is subtracted from the expected subsampled signal $\tilde{d}_i$ to yield error $e_i$. Thus, error $e_i$ is the difference between the actual sub-sampled signal and the expected subsampled signal.

At multiplication node 57, the error $e_i$ is multiplied by the noiseless data vector $\hat{\alpha}_i$. The product of such multiplication is sent to adaptation matrix 56, which translates this information regarding the error of cross-correlation vector $e_i * \hat{\alpha}_i$ into parameters or instructions for adjustable filter 44. Such instructions enter integrator bank 58, which may comprise one or a plurality of integrators. Integrator bank 58 produces a compensation vector, filter coefficient vector $\underline{c}$, which controls adjustable filter 44 to adjust the compensation provided by the filter. Thus, the calculation of error $e_i$ for a subsampled signal is used to adjust subsequent signals passing through adjustable filter 44 to compensate for distortion caused by channel 42.

Component boxes 43 and 45 may be implemented as digital circuits, analog circuits or a combination of digital and analog circuits. The components of component box 43 operate at the full speed of channel 42, and the components of component box 45 operate at 1/N speed of the channel. In particular embodiments, the subsampling rate N of subsampling switches 52 may be approximately thirty-two or larger. Therefore, subsampling switches 52a and 52b enable signal processing to be performed at a slower rate than the rate of the signal passing through the channel. The physical characteristics of the channel do not typically vary significantly. Thus, the error $e_i$ does not need to be calculated at the full speed of the channel. Accordingly, particular embodiments of the present invention may utilize subsampling to compensate for interference. Utilizing subsampling to calculate the error $e_i$ reduces the negative impact of the circuitry needed to calculate the error $e_i$ on the speed of continuous data sequence $\alpha_k$ passing through the adaptive equalization system. Thus, the speed of the data sequence through the equalizer may be faster, and the overall efficiency of adaptive equalization system 40 may be improved.

Figure 4:
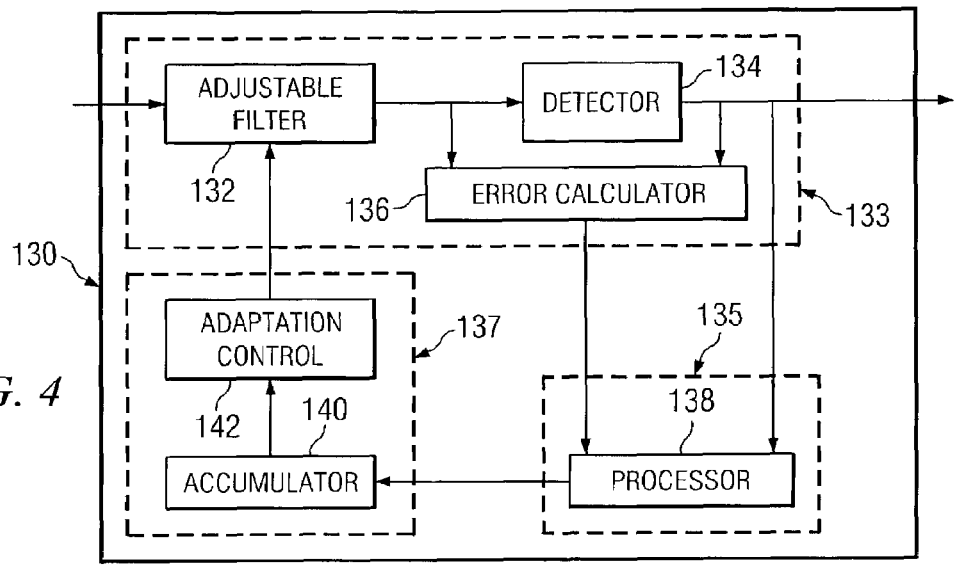
FIG. 4 illustrates an adaptive equalization system utilizing an accumulator for producing vector output, in accordance with a particular embodiment of the present invention.

FIG. 4 illustrates an adaptive equalization system 130 utilizing an accumulator 140 to form vector output, in accordance with another embodiment of the present invention. Adaptive equalization system 130 includes an adjustable filter 132, a detector 134, an error calculator 136, a processor 138, an accumulator 140 and adaptation control 142.

Adjustable filter 132 receives a signal that has been transmitted over a channel, such as channel 16 of FIG. 1. Adjustable filter 132 compensates for distortion in the signal caused by the channel. Adaptation control 142 provides control and adjustment parameters for adjustable filter 132.

After the signal has passed through adjustable filter 132, it travels to detector 134 which recovers the originally transmitted data sequence. Error calculator 136 performs signal processing to calculate an error associated with the signal. The error is sampled at a particular interval before entering processor 138. In particular embodiments, the signal may be sampled before calculating the error. In such cases, the error is calculated from the sampled signal.

After the error is sampled, it is received by processor 138. Processor 138 uses sampled outputs of detector 134 to process data points for cross-correlation with the sampled error. The processing of processor 138 is sent to accumulator 140. Accumulator 140 creates a cross-correlation vector output based on the serial operation of processor 138. Accumulator 140 waits to receive multiple data points cross-correlated with error from processor 138 to create the cross-correlation vector output. Processor 138 may utilize a low-pass filter and a pulse generator controlled by accumulator 140 in its processing operations. The vector output of accumulator 140 is utilized by adaptation control 142 to determine parameters or instructions for adjustable filter 132. Adjustable filter 132 uses such instructions to provide compensation to subsequent signals for distortion caused by the channel.

In the illustrated embodiment, component box 133 includes adjustable filter 132, detector 134 and error calculator 136; component box 135 includes processor 138; and component box 137 includes accumulator 140 and adaptation control 142. Component boxes 133 and 135 may be implemented as digital circuits, analog circuits or a combination of digital and analog circuits. Component box 137 may be implemented as a digital circuit, analog circuit, software or a combination of the preceding.

The components of component box 133 operate at the speed of the channel through which the signal is received. Since the error is sampled at a particular interval before entering component box 135, processor 138 operates at a slower speed than the speed of the components of component box 133. Moreover, since accumulator 140 must wait to receive multiple cross-correlated data points from sampled error and detector output, the components of component box 137 operate at a slower speed than the speed of the components of component box 135.

Because adaptive equalization system 130 provides compensation from signal processing based on vectors produced from scalar data (as opposed to vectors produced from vector data all the time as illustrated in FIGS. 2 and 3), the circuitry of the system may be less complex. Moreover, the amount of hardware may be reduced as well. For example, adaptive equalization system 130 may not need a shift register for signal processing that would operate at the full speed of the channel through which the signal is received.

FIG. 5 illustrates an adaptive equalization system 60 utilizing an accumulator 80 for producing vector output, in accordance with another embodiment of the present invention. Adaptive equalization system 60 utilizes accumulator 80 to produce a vector output for cross-correlation with error instead of using a shift register as used by adaptive equalization system 40 of FIG. 3. Adaptive equalization system 60 also includes sampling switch 62, adjustable filter 64, detector 66, target response filter 68, summation node 70, subsampling switches 72, pulse generator 74, multiplication node 76, low-pass filter 78, adaptation matrix 82 and integrator bank 84.

Adaptive equalization system 60 receives a transmitted data sequence that has passed through channel 61. In this embodiment, sampling switch 62 is located between channel 61 and adjustable filter 64. Thus, after the data sequence $\alpha_k$ is transmitted over channel 61, the received signal y(t) is sampled at sampling switch 62 at sampling time t=kT to yield a sampled $y_k$. Sampled signal $y_k$ enters adjustable filter 64 which compensates for distortion caused by channel 61.

The signal then enters detector 66 which recovers the original noiseless data sequence $\hat{\alpha}_k$. Target response filter 68 calculates an expected sampled predetection signal $\hat{d}_k$, or the signal that is expected to be output from adjustable filter 64. At summation node 70, the sampled signal $\hat{d}_k$ is subtracted from the expected sampled predetection signal $\hat{d}_k$ to yield an error $e_k$, which may comprise an amplitude error of the transmitted signal. Error $e_k$ is a scalar error.

The error $e_k$ is sampled at subsampling switch 72a at sampling time k=iN to yield subsampled scalar error $e_i$. Subsampling switch 72b subsamples original noiseless data sequence $\hat{\alpha}_k$ from detector 66 at sampling time k=iN−j to yield subsampled noiseless data sequence $\hat{\alpha}_{i,j}$, where N represents a sub-sampling rate, i corresponds to the index of the sub-sampled data series and j represents a sub-sampling phase corresponding to the index of the cross-correlation vector produced by accumulator 80. Thus, $\hat{\alpha}_{i,j}$ refers to $\hat{\alpha}_{0N-j}, \hat{\alpha}_{1N-j}, \hat{\alpha}_{2N-j}, \hat{\alpha}_{3N-j} \ldots \hat{\alpha}_{iN-j} \ldots$ and is scalar data. Pulse generator 74 produces a subsampling pulse for subsampling switches 72a and 72b. Accumulator 80 provides phase control to control pulse generator 74 and the value of j. The value of index j will cycle through count values to produce a vector of a particular length. For example, to produce a vector of three elements at accumulator 80, index j may cycle through values 0, 1 and 2. Thus, j is a delay that is the difference between the phases at which subsampling switches 72a and 72b operate.

At multiplication node 76, the subsampled error $e_i$ is multiplied by the subsampled noiseless data sequence $\hat{\alpha}_{i,j}$ to yield $e_i*\hat{\alpha}_{i,j}$, which is sent to low-pass filter 78. Low-pass filter 78 takes an average of multiple values of $e_i*\hat{\alpha}_{i,j}$, for each value of j. For example, if j=0, low-pass filter 78 averages multiple data points $e_{0N}*\hat{\alpha}_{0N-0}, e_{1N}*\hat{\alpha}_{1N-0}, e_{2N}*\hat{\alpha}_{2N-0}, \ldots e_{nN}*\hat{\alpha}_{nN-0}, \ldots$ If j=1, low-pass filter 78 averages multiple data points $e_{0N}*\hat{\alpha}_{0N-1}, e_{1N}*\hat{\alpha}_{1N-1}, e_{2N}*\hat{\alpha}_{2N-0}, \ldots e_{nN}*\hat{\alpha}_{nN-1}, \ldots$ If j=2, low-pass filter 78 averages multiple data points $e_{0N}*\hat{\alpha}_{0N-2}, e_{1N}*\hat{\alpha}_{1N-2}, e_{2N}*\hat{\alpha}_{2N-2}, \ldots e_{nN}*\hat{\alpha}_{nN-2}, \ldots$ Low-pass filter 78 yields $E[e_i*\hat{\alpha}_{i,j}]$, which is sent to accumulator 80. This process is repeated for each value of j.

Accumulator 80 accumulates $E[e_i*\hat{\alpha}_{i,j}]$ for each value of j and produces a vector output $E[e_k*\hat{\alpha}_k]$ which is sent to adaptation matrix 82. As stated above, accumulator 80 controls j, and the values of j correspond to the length of the vector produced by accumulator 80. Such length should be long enough to observe most of the ISI caused by channel 61. For example, if the pre-cursor ISI, that is ISI before the received symbol, is effectively one symbol long and the post-cursor ISI, that is ISI after the received symbol, is effectively four symbols long, the length of the vector produced by accumulator 80 should be six and the value of index j should cycle through values −1, 0, 1, 2, 3, 4.

Adaptation matrix 82 translates the information regarding the error of the vector $E[e_k*\hat{\alpha}_k]$ into parameters or instructions for adjustable filter 64. Such instructions pass through integrator bank 84 which may include a number of integrators corresponding to the length of a compensation vector $\underline{c}$. Integrator bank 84 produces the compensation vector, filter coefficient vector $\underline{c}$, which controls adjustable filter 64 to adjust the compensation provided by the filter.

Component boxes 65 and 67 may be implemented as digital circuits, analog circuits or a combination of digital and analog circuits. Component box 69 may be implemented as a digital circuit, analog circuit, software or a combination of the preceding.

The components of component box 65 operate at the full speed of the channel rate, and the components of component box 67 operate at 1/N speed of the channel rate. The components of component box 69 operate at a much lower speed than the channel rate, because accumulator 80 must wait to receive averages for multiple values of j before producing its vector output. Thus, subsampling switches 72a and 72b enable signal processing to occur both in component boxes 67 and 69 at a slower rate than the full channel rate thus improving the full channel rate. Moreover, because adaptive equalization system 60 provides compensation based on vectors produced from scalar data (as opposed to vectors produced from vector data all the time as illustrated in FIGS. 2 and 3), the circuitry of the system may be less complex, and the necessary amount of hardware for the system may be reduced.

Figure 6:
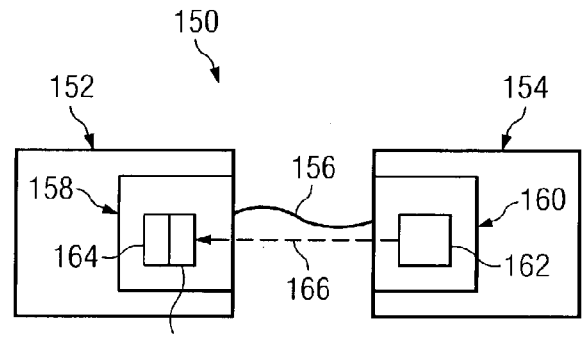
FIG. 6 illustrates a network system utilizing adaptive equalization with feedback control, in accordance with a particular embodiment of the present invention.

FIG. 6 illustrates a network system 150 utilizing adaptive equalization with feedback control, in accordance with a particular embodiment of the present invention. Network system 150 includes network elements 152 and 154 coupled together by a channel 156 through which a signal may be communicated. Network element 152 includes a transmitter 158, and network element 154 includes a receiver 160. Transmitter 158 includes adjustable filter 164 and feedback monitor 167. Thus, adjustable filter 164 is positioned before channel 156. Adjustable filter 164 provides error compensation to a signal transmitted through channel 156. Receiver 160 includes adaptive equalization components 162 that process a received signal to determine instructions or control parameters for adjustable filter 164.

Network system 150 includes feedback control 166 to communicate the adjustable filter instructions or control parameters determined by adaptive equalization components 162 to adjustable filter 164 using feedback monitor 167 so that transmitter 158 may provide pre-emphasis to a signal through adjustable filter 164 to compensate for expected distortions. Feedback control 166 may communicate other information to transmitter 158 as well. In particular embodiments, feedback control 166 may communicate information so that transmitter 158 may provide high-resolution control of its output. The feedback control mechanism of network system 150 may be implemented by any of a number of ways known to one skilled in the art. For example, the control information may be communicated back to transmitter 158 through channel 156. Thus, the use of feedback control 166 enables transmitter 158 to provide pre-emphasis and high resolutions control of its output based on error information determined by receiver 160. Therefore, efficiency of network system 150 may be improved.

Figure 7:
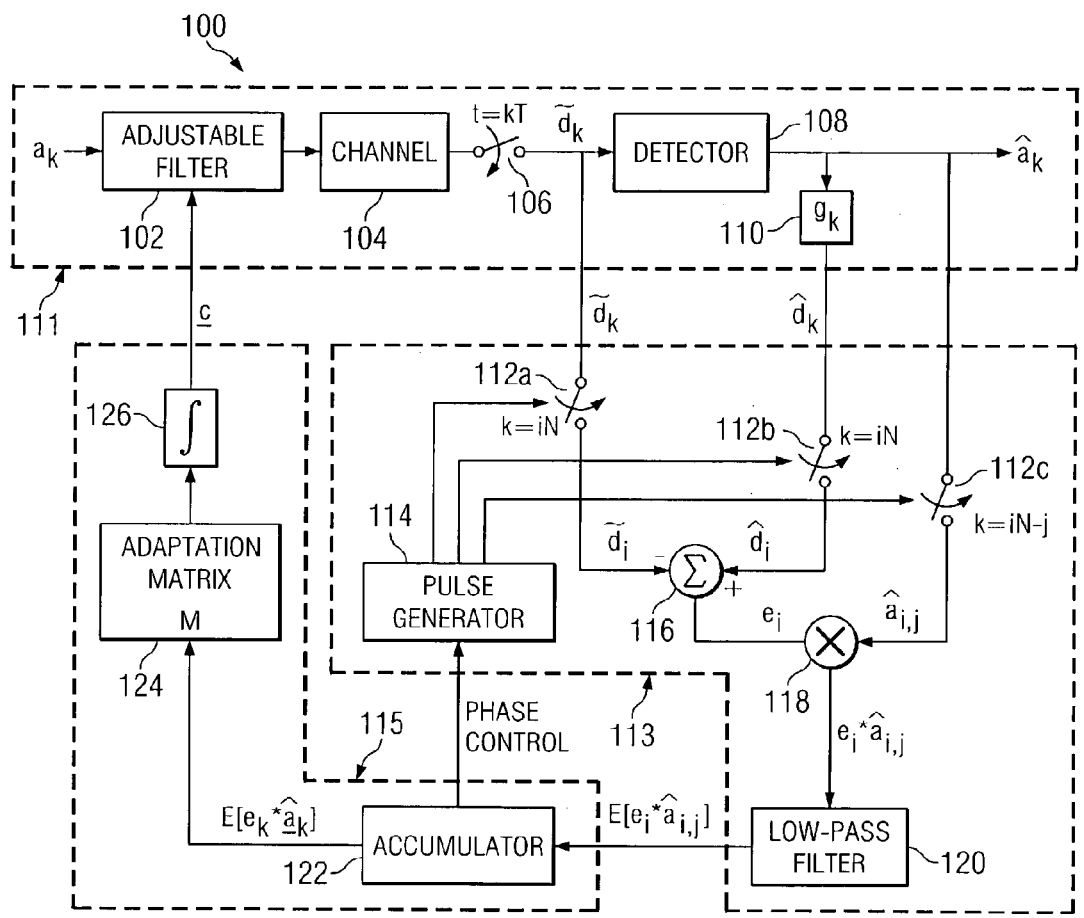
FIG. 7 illustrates an adaptive equalization system utilizing an accumulator and feedback control, in accordance with another embodiment of the present invention.

FIG. 7 illustrates an adaptive equalization system 100 utilizing an accumulator and feedback control, in accordance with another embodiment of the present invention. In this embodiment, an adjustable filter 102 is located before a channel 104 over which a data sequence is to be transmitted. Adjustable filter 102 may be located in a transmitter while other signal processing components may be located in a receiver that receives the transmitted signal after it has passed through the channel. Feedback control may be provided from the receiver to a feedback monitor of the transmitter so that error information produced by signal processing components of the receiver may be utilized by adjustable filter 102 to provide compensation in the signal before transmission. Moreover, in this embodiment error calculation is performed after subsampling, as also described with respect to adaptive equalization system 40 of FIG. 3.

Adaptive equalization system 100 also includes sampling switch 106, detector 108, target response filter 110, subsampling switches 112, pulse generator 114, summation node 116, multiplication node 118, low-pass filter 120, accumulator 122, adaptation matrix 124 and integrator bank 126.

As stated above, adjustable filter 102 provides compensation to a data sequence $\alpha_k$ to be transmitted over channel 104. The data sequence is sampled at sampling switch 106 at sampling time t=kT to yield a sampled signal $ã_k$.

The signal enters detector 108 which recovers the original noiseless data sequence $\hat{\alpha}_k$. Target response filter 110 calculates an expected sampled predetection signal $ã_k$, or the signal that is expected to be received over channel 104.

Subsampling switch 112a subsamples the sampled signal $ã_k$ at sampling time k=iN to generate subsampled signal $ã_i$. Subsampling switch 112b subsamples the expected sampled predetection signal $ã_k$ at sampling time k=iN to generate expected subsampled predetection signal $ã_i$. At summation node 116, the subsampled signal $ã_i$ is subtracted from the expected subsampled signal $ã_i$ to yield scalar error $e_i$. Thus, error $e_i$ is the difference between the actual subsampled signal and the expected subsampled signal.

Subsampling switch 112c subsamples the output of detector 66, original noiseless data sequence $\hat{\alpha}_k$, at sampling time k=iN−j to yield subsampled noiseless data sequence $\hat{\alpha}_{i,j}$ which is scalar data. Thus, j is a delay that is the difference between the phases at which subsampling switches 112b and 112c operate. Pulse generator 114 produces a subsampling pulse for subsampling switches 112a, 112b and 112c. The value of j corresponds to the index of the cross-correlation vector produced by accumulator 122. Accumulator 122 provides phase control to control pulse generator 114 and the value of j.

At multiplication node 118, the subsampled scalar error $e_i$ is multiplied by the subsampled noiseless data sequence $\hat{\alpha}_{i,j}$ to yield $e_i*\hat{\alpha}_{i,j}$, which is sent to low-pass filter 120. Low-pass filter 120 takes an average of multiple values of $e_i*\hat{\alpha}_{i,j}$ for each value of j and yields $E[e_i*\hat{\alpha}_{i,j}]$, which is sent to accumulator 122.

Accumulator 122 accumulates $E[e_i*\hat{\alpha}_{i,j}]$ for each value of j and produces a vector output $E[e_k*\hat{\underline{\alpha}}_k]$ which is sent to adaptation matrix 124. Adaptation matrix 124 translates the information regarding the error of the vector $E[e_k*\hat{\underline{\alpha}}_k]$ into parameters or instructions for adjustable filter 102. Such instructions pass through integrator bank 126, which may include a number of integrators corresponding to the length of a compensation vector $\underline{c}$. Integrator bank 126 produces the compensation vector, filter coefficient vector $\underline{c}$, that controls adjustable filter 102 to adjust the compensation provided by the filter. Feedback control is utilized to communicate the control parameters of adjustable filter 102 back to the filter which is located in a transmitter so that the data sequence may be compensated before transmission through channel 104.

In particular embodiments, feedback control may communicate other information back to the transmitter. For example, feedback control may communicate intermediate information back to the transmitter. Such intermediate information may include the output of the accumulator or the output of the adaptation matrix. In such cases, some components such as the adaptation matrix and/or the integrator bank may be located at the transmitter for calculation of the control parameters for the adjustable filter. In some cases, the error $e_i$ may be communicated from the receiver to the transmitter using feedback control, and subsequent operations for calculating the control parameters for the adjustable filter may be performed at the transmitter.

Component boxes 111 and 113 may be implemented as digital circuits, analog circuits or a combination of digital and analog circuits. Component box 115 may be implemented as a digital circuit, analog circuit, software or a combination of the preceding.

The components of component box 111 operate at the full speed of the channel rate, and the components of component box 113 operate at 1/N speed of the channel rate. The components of component box 115 operate at a much lower speed than the channel rate, because accumulator 122 must wait to receive averages for multiple values of j before producing its vector data output. Thus, subsampling switches 112a, 112b and 112c enable signal processing to occur both in component boxes 113 and 115 at a slower speed than the speed of the signal transmitted through the channel thus improving the full channel speed. Moreover, because adaptive equalization system 100 provides compensation based on vectors produced from scalar data (as opposed to vectors produced from vector data all the time as illustrated in FIGS. 2 and 3), the circuitry of the system may be less complex, and the necessary amount of hardware for the system may be reduced.

It should be understood that particular embodiments may include an adaptive equalization system similar to that illustrated in FIG. 7 but with the adjustable filter located after the channel, for example with the adjustable filter located within a receiver that receives the signal transmitted through the channel. Particular embodiments may also include an adaptive equalization system utilizing an adjustable filter divided into two filters, one in the transmitter and another in the receiver.

Figure 8:
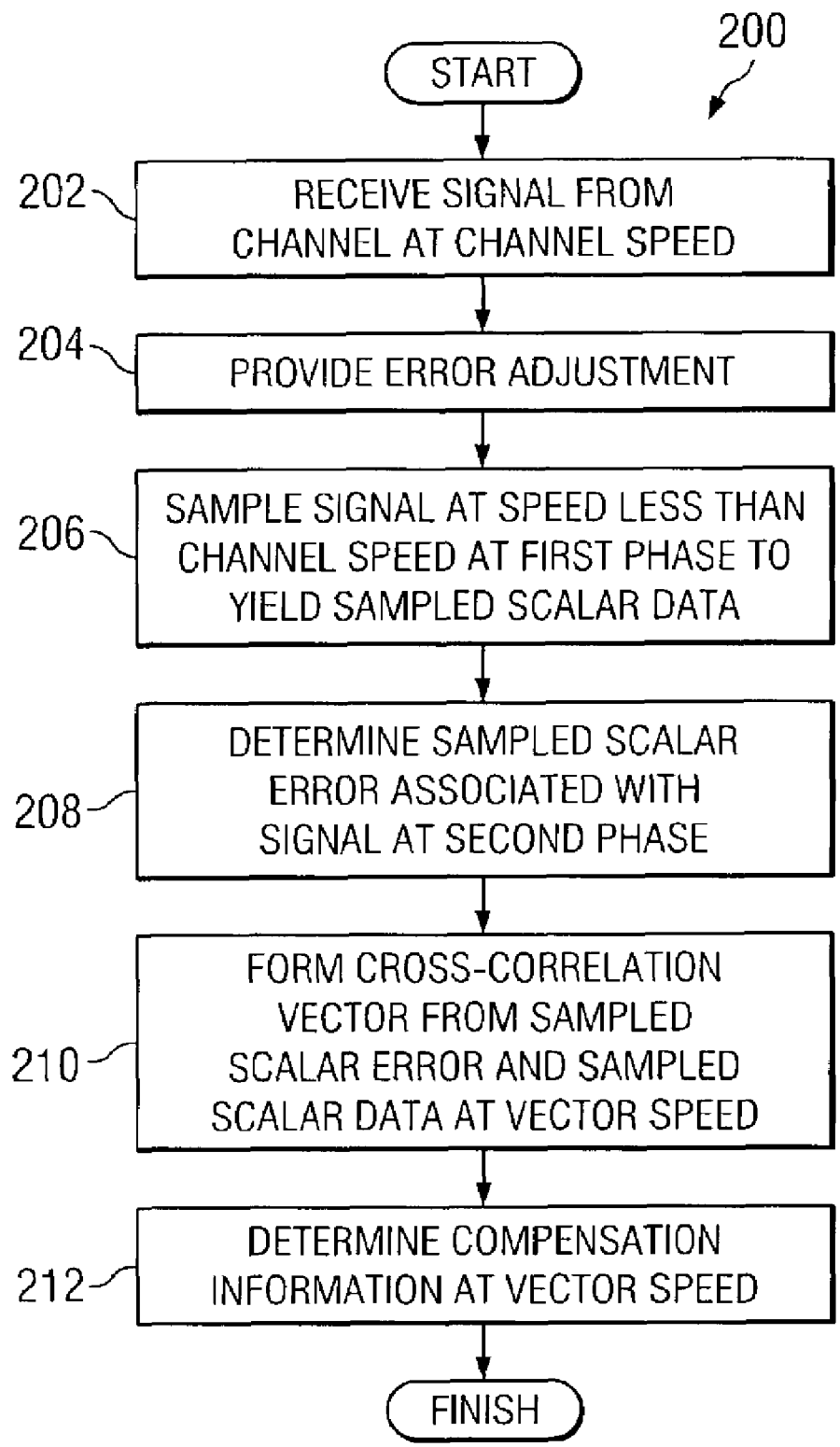
FIG. 8 is a flow chart illustrating a method for processing a signal, in accordance with an embodiment of the present invention.

FIG. 8 is a flow chart illustrating a method 200 for processing a signal, in accordance with an embodiment of the present invention. The method begins at step 202, where a signal is received from a channel at a channel speed. At step 204, error adjustment is provided to the signal. Such error adjustment may be provided by an adjustable filter.

At step 206, the signal is sampled at a speed less than the channel speed at a first phase to yield sampled scalar data. In particular embodiments, the signal may be sampled at a sampling switch at a speed that is 1/32 of the channel speed. At step 208, a sampled scalar error associated with the signal is determined at a second phase. The difference between the first phase and the second phase may be a variable delay. The sampled scalar error may comprise a sampled scalar amplitude error or residual intersymbol interference. The sampled scalar error may be determined by determining a scalar error and sampling the scalar error. The sampled scalar error may also be determined by sampling the signal at the second phase and determining the sampled scalar error from the signal sampled at the second phase.

At step 210, a cross-correlation vector is formed from the sampled scalar error and the sampled scalar data at a vector speed. The cross-correlation vector may be formed by an accumulator that accumulates a plurality of data points of the sampled scalar data cross-correlated with the sampled scalar error. The accumulator may control a pulse generator to aid in this process by varying the delay and may receive the cross-correlated data points for the cross-correlation vector from a low-pass filter. The vector speed is less than the speed at which the signal is sampled since the accumulator waits on the plurality of data points before forming the cross-correlation vector.

At step 212, compensation information is determined for the error adjustment at the vector speed. The compensation information is based on the cross-correlation vector and may be determined at an adaptation control that includes an adaptation matrix and an integrator bank. The compensation information may comprise a compensation vector for use by an adjustable filter in providing adjustment to the signal distortion.

Steps may be modified, added or omitted without departing from the scope of the invention. Additionally, steps may be performed in any suitable order without departing from the scope of the invention.

Although the present invention has been described in detail, various changes and modifications may be suggested to one skilled in the art. It is intended that the present invention encompass such changes and modifications as falling within the scope of the appended claims.

What is claimed is:

1. A method for processing a signal, comprising:
   receiving a signal from a channel at a channel speed;
   providing error adjustment to the signal;
   sampling the signal at a speed less than the channel speed to yield sampled scalar data, the signal sampled at a first phase;
   determining a sampled scalar error associated with the signal at a second phase, the difference between the first phase and the second phase comprising a delay;
   forming a cross-correlation vector from the sampled scalar error and the sampled scalar data at a vector speed, the vector speed less than the speed at which the signal is sampled; and
   determining compensation information for the error adjustment, the compensation information based on the cross-correlation vector, and the compensation information determined at the vector speed.

2. The method of claim 1, wherein providing error adjustment comprises providing error adjustment using the compensation information.

3. The method of claim 1, wherein forming a cross-correlation vector from the sampled scalar error and the sampled scalar data comprises:
   forming a plurality of cross-correlated data points of the sampled scalar data cross-correlated with the sampled scalar error, wherein forming the plurality of cross-correlated data points comprises varying the delay;
   accumulating the plurality of cross-correlated data points; and
   forming a cross-correlation vector from the plurality of cross-correlated data points.

4. The method of claim 1, wherein determining a sampled scalar error associated with the signal at a second phase comprises:
   determining a scalar error associated with the signal; and
   sampling the scalar error at the second phase.

5. The method of claim 1, wherein determining a sampled scalar error associated with the signal at a second phase comprises:
   sampling the signal at the second phase; and
   determining a sampled scalar error associated with the signal from the signal sampled at the second phase.

6. The method of claim 1, wherein the speed at which the signal is sampled is approximately $\frac{1}{32}$ of the channel speed.

7. The method of claim 1, wherein determining a sampled scalar error associated with the signal comprises determining a sampled scalar amplitude error associated with the signal.

8. A system for processing a signal, comprising:
   an adjustable filter operable to provide error adjustment to a signal received from a channel at a channel speed;
   a sampling switch operable to sample the signal at a speed less than the channel speed to yield sampled scalar data, the sampling switch operable to sample the signal at a first phase;
   an error calculator operable to determine a sampled scalar error associated with the signal at a second phase, the difference between the first phase and the second phase comprising a delay;
   an accumulator operable to form a cross-correlation vector from the sampled scalar error and the sampled scalar data at a vector speed, the vector speed less than the speed at which the signal is sampled; and
   adaptation control operable to determine compensation information for the adjustable filter for providing error adjustment to the signal, the compensation information based on the cross-correlation vector, and the compensation information determined at the vector speed.

9. The system of claim 8, wherein the accumulator is further operable to:
   vary the delay to form a plurality of cross-correlated data points of the sampled scalar data cross-correlated with the sampled scalar error;
   accumulate the plurality of cross-correlated data points; and
   form the cross-correlation vector from the plurality of cross-correlated data points.

10. The system of claim 9, further comprising:
    a pulse generator operable to generate a pulse for the sampling switch; and
    a low-pass filter operable to form the plurality of cross-correlated data points.

11. The system of claim 8:
    wherein an error calculator operable to determine a sampled scalar error associated with the signal at a second phase comprises an error calculator operable to determine a scalar error associated with the signal; and
    further comprising a second sampling switch operable to sample the scalar error at the second phase.

12. The system of claim 8:
    further comprising a second sampling switch operable to sample the signal at the second phase; and
    wherein an error calculator operable to determine a sampled scalar error associated with the signal at a second phase comprises an error calculator operable to determine a sampled scalar error associated with the signal from the signal sampled at the second phase.

13. The system of claim 8, wherein the sampling switch is operable to sample the signal at a speed that is approximately $\frac{1}{32}$ of the channel speed.

14. The system of claim 8, wherein the error calculator is operable to determine a sampled scalar amplitude error associated with the signal.

15. A logic for processing a signal, the logic embedded in a medium and operable to:
    receive a signal from a channel at a channel speed;
    provide error adjustment to the signal;
    sample the signal at a speed less than the channel speed to yield sampled scalar data, the signal sampled at a first phase;
    determine a sampled scalar error associated with the signal at a second phase, the difference between the first phase and the second phase comprising a delay;
    form a cross-correlation vector from the sampled scalar error and the sampled scalar data at a vector speed, the vector speed less than the speed at which the signal is sampled; and determine compensation information for the error adjustment, the compensation information based on the cross-correlation vector, and the compensation information determined at the vector speed.

16. The logic of claim 15, wherein logic operable to provide error adjustment comprises logic operable to provide error adjustment using the compensation information.

17. The logic of claim 15, wherein logic operable to form a cross-correlation vector from the sampled scalar error and the sampled scalar data comprises:
   logic operable to form a plurality of cross-correlated data points of the sampled scalar data cross-correlated with the sampled scalar error by varying the delay;
   logic operable to accumulate the plurality of cross-correlated data points; and
   logic operable to form a cross-correlation vector from the plurality of cross-correlated data points.

18. The logic of claim 15, wherein logic operable to determine a sampled scalar error associated with the signal at a second phase comprises:
   logic operable to determine a scalar error associated with the signal; and
   logic operable to sample the scalar error at the second phase.

19. The logic of claim 15, wherein logic operable to determine a sampled scalar error associated with the signal at a second phase comprises:
   logic operable to sample the signal at the second phase; and
   logic operable to determine a sampled scalar error associated with the signal from the signal sampled at the second phase.

20. The logic of claim 15, wherein logic operable to determine a sampled scalar error associated with the signal comprises logic operable to determine a sampled scalar amplitude error associated with the signal.

21. A system for processing a signal, comprising:
   means for receiving a signal from a channel at a channel speed;
   means for providing error adjustment to the signal;
   means for sampling the signal at a speed less than the channel speed to yield sampled scalar data, the signal sampled at a first phase;
   means for determining a sampled scalar error associated with the signal at a second phase, the difference between the first phase and the second phase comprising a delay;
   means for forming a cross-correlation vector from the sampled scalar error and the sampled scalar data at a vector speed, the vector speed less than the speed at which the signal is sampled; and
   means for determining compensation information for the error adjustment, the compensation information based on the cross-correlation vector, and the compensation information determined at the vector speed.

22. A method for processing a signal, comprising:
   receiving a signal from a channel at a channel speed;
   providing error adjustment to the signal at an adjustable filter;
   sampling the signal at a speed less than the channel speed to yield sampled scalar data, the signal sampled at a first phase;
   determining a scalar error associated with the signal;
   sampling the scalar error at a second phase to yield a sampled scalar error, the difference between the first phase and the second phase comprising a delay;
   forming a plurality of cross-correlated data points of the sampled scalar data cross-correlated with the sampled scalar error by varying the delay;
   accumulating the plurality of cross-correlated data points;
   forming a cross-correlation vector from the plurality of cross-correlated data points at a vector speed, the vector speed less than the speed at which the signal is sampled; and
   determining a compensation vector for the error adjustment, the compensation vector based on the cross-correlation vector, and the compensation vector formed at the vector speed.

* * * * *

UNITED STATES PATENT AND TRADEMARK OFFICE
CERTIFICATE OF CORRECTION

| | |
|---|---|
| PATENT NO. | : 7,289,555 B2 |
| APPLICATION NO. | : 10/359379 |
| DATED | : October 30, 2007 |
| INVENTOR(S) | : Yasuo Hidaka |

It is certified that error appears in the above-identified patent and that said Letters Patent is hereby corrected as shown below:

Column 5, Line 9, after "predetection signal" delete "dhd i" and insert -- $\hat{d}_i$ --.

Signed and Sealed this

Twenty-third Day of December, 2008

JON W. DUDAS
*Director of the United States Patent and Trademark Office*